United States Patent [19]
Sugiuti

[11] Patent Number: 6,099,686
[45] Date of Patent: *Aug. 8, 2000

[54] WET PROCESSING SYSTEM

[75] Inventor: Hiroyuki Sugiuti, Kumamoto, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/504,664

[22] Filed: Jul. 20, 1995

[30] Foreign Application Priority Data

Jul. 22, 1994 [JP] Japan ................................ 6-170603

[51] Int. Cl.⁷ ...................................................... C23F 1/02

[52] U.S. Cl. ...................... 156/345; 118/500; 134/902; 206/711; 206/831; 206/832; 422/65; 422/292; 422/297; 422/300; 294/137; 414/222; 414/416; 414/935

[58] Field of Search ............................ 156/345; 206/711, 206/831, 832; 414/222, 416, 935; 118/500; 134/902; 422/65, 292, 297, 300; 294/137

[56] References Cited

U.S. PATENT DOCUMENTS

| | | | |
|---|---|---|---|
| 3,964,957 | 6/1976 | Walsh | 156/345 |
| 4,515,104 | 5/1985 | Lee | 118/500 |
| 5,261,431 | 11/1993 | Ueno et al. | 134/66 |
| 5,301,700 | 4/1994 | Kamikawa et al. | 134/76 |

FOREIGN PATENT DOCUMENTS

| | | |
|---|---|---|
| 0658923 | 6/1995 | European Pat. Off. . |
| 61-170043 | 7/1986 | Japan . |

*Primary Examiner*—Christopher L. Chin
*Assistant Examiner*—V. Ryan
*Attorney, Agent, or Firm*—Sughrue, Mion, Zinn, Macpeak & Seas, PLLC

[57] ABSTRACT

In a wet processing system included in a semiconductor device production line, a wafer carrier has bars formed with grooves for receiving the edge portions of wafers, and a pair of support plates each having a width smaller than the diameter of the wafers. The carrier reduces a volume required of a processing bath and promotes the smooth flow of aqueous solutions. Hence, the system reduces the consumption of chemicals and pure water as well as the cleaning time and other processing times.

6 Claims, 4 Drawing Sheets

WET PROCESSING SYSTEM

BACKGROUND OF THE INVENTION

The present invention relates to a wet processing system included in a semiconductor device production line and, more particularly, to the structure of a wafer carrier to be loaded with wafers.

A semiconductor device production line includes various kinds of wet processing, e.g., cleaning and etching. Each wet processing is implemented by a system having a bath filled with chemicals, a wafer carrier loaded with wafers and introducing them into the bath, and a transport jig for transporting the wafer carrier. This kind of wet processing system is disclosed in, for example, Japanese Patent Laid-Open Publication No. 61-170043. However, a problem with the conventional wet processing system is that because the wafer carrier is implemented as a box, the size of the bath is determined by the size of the carrier. As a result, more than necessary amounts of chemicals and pure water are consumed. Another problem is that the side walls of the carrier formed with a number of grooves obstruct the smooth flow of the liquids. This brings about the deposition of impurities on the wafers and thereby increases the cleaning time, among others.

SUMMARY OF THE INVENTION

It is, therefore, an object of the present invention to provide a wet processing system capable of reducing the consumption of chemicals and pure water as well as the cleaning time and other processing times.

A wet processing system of the present invention has a processing bath filled with chemicals, a wafer carrier for carrying wafers, and a transport jig for conveying the wafer carrier by holding the upper end portion of the wafer carrier. The wafer carrier has at least three bars each being formed with a plurality of grooves for receiving the edge portions of the wafers, a pair of support plates supporting the opposite ends of the bars arranged complimentarily to the contour of the wafers such that the wafers are each held in an upright position with the lower portion thereof received in the grooves at at least three points thereof, and a pair of lugs protruding from the upper portion of the outer surface of each support plate, and for retaining the pawls of arms constituting the transport jig.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1A:
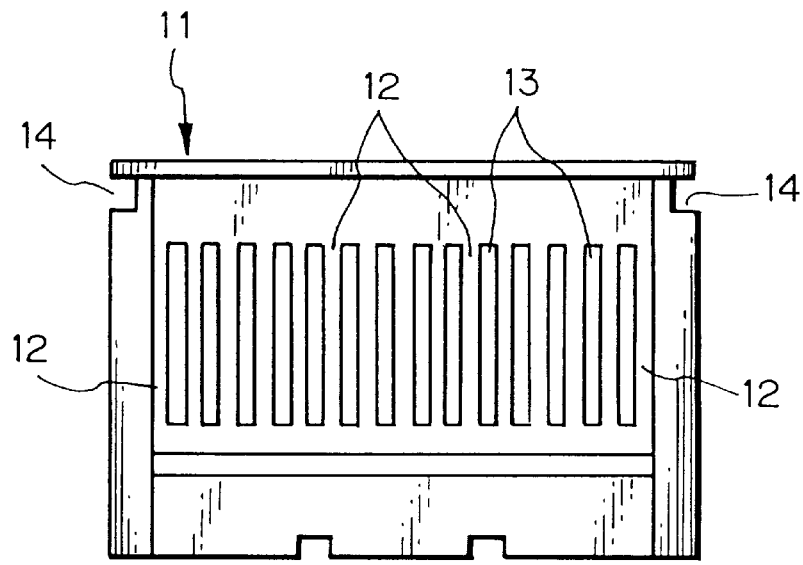
FIG. 1A is a side elevation showing a wafer carrier included in a conventional wet processing system.

To better understand the present invention, a brief reference will be made to a conventional wet processing system, shown in FIGS. 1A and 1B. The processing system to be described is of the type taught in previously mentioned Japanese Patent Laid-Open Publication No. 61-170043. As shown in FIG. 1A, the processing system has a wafer carrier 11 implemented as a box made of Teflon. A number of guides 12 and a number of grooves 13 are formed in opposite longitudinal side walls of the wafer carrier 11. The guides 12 and the grooves 13 of the opposite side walls face each other. Two recesses 14 are formed in the upper portion of each of opposite end walls of the wafer carrier 11 with respect to the longitudinal direction of the carrier 11, i.e., four recesses 14 in total are formed in the carrier 11. The recesses 14 respectively engage with the arms of a transport jig during the transport of the wafer carrier 11. Wafers 10 (see FIG. 1B) are respectively received in the grooves 13 in an upright position and arranged at predetermined intervals.

Figure 1B:
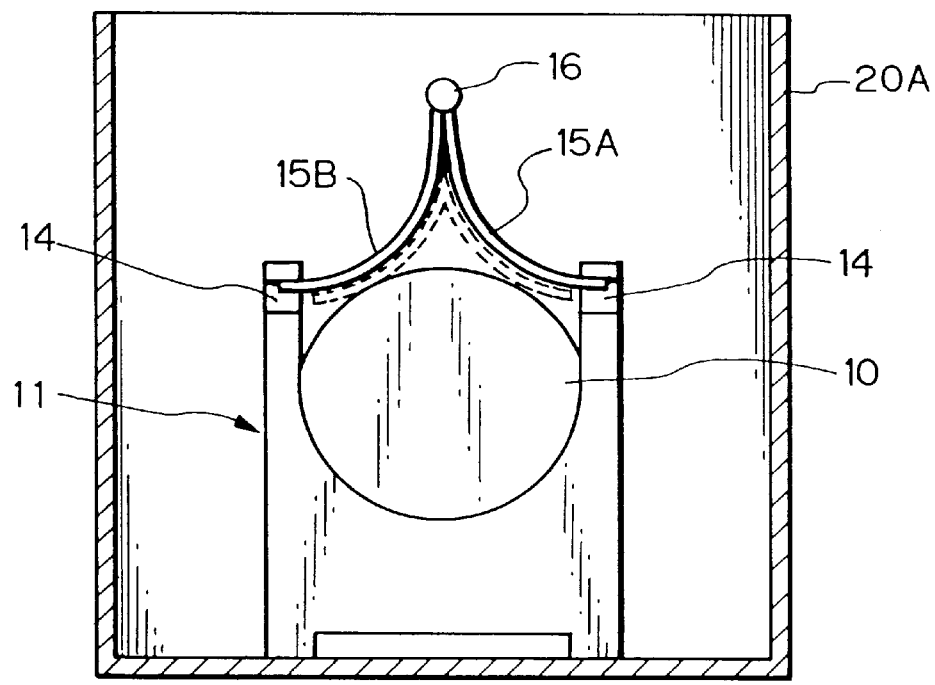
FIG. 1B is a side elevation showing the wafer carrier of the conventional system disposed in a processing bath, together with a transport jig.

As shown in FIG. 1B, a transporter has, for example, two pairs of arms 15A and 15B each being pivotable about a fulcrum 16 provided on the front end of the transporter. The transporter automatically transports the wafer carrier 11 into, for example, an etching bath 20A with the arms 15A and 15B thereof respectively engaging with the recesses 14 of the carrier 11. Alternatively, the carrier 11 may be brought to the bath 20A by a transport jig operated by hand and having arms similar to the arms 15A and 15B.

The conventional wafer carrier 11 has some problems yet to be solved, as discussed earlier. Specifically, because the carrier 11 is implemented as a box, the size of the bath 20A is determined by the size of the carrier 11. As a result, more than necessary amounts of chemical and pure water are consumed. Moreover, the side walls of the carrier 11 having the grooves 13 obstruct the smooth flow of the liquids. This brings about the deposition of impurities on the wafers 10 and thereby increases the cleaning time and other processing times.

Figure 2A:
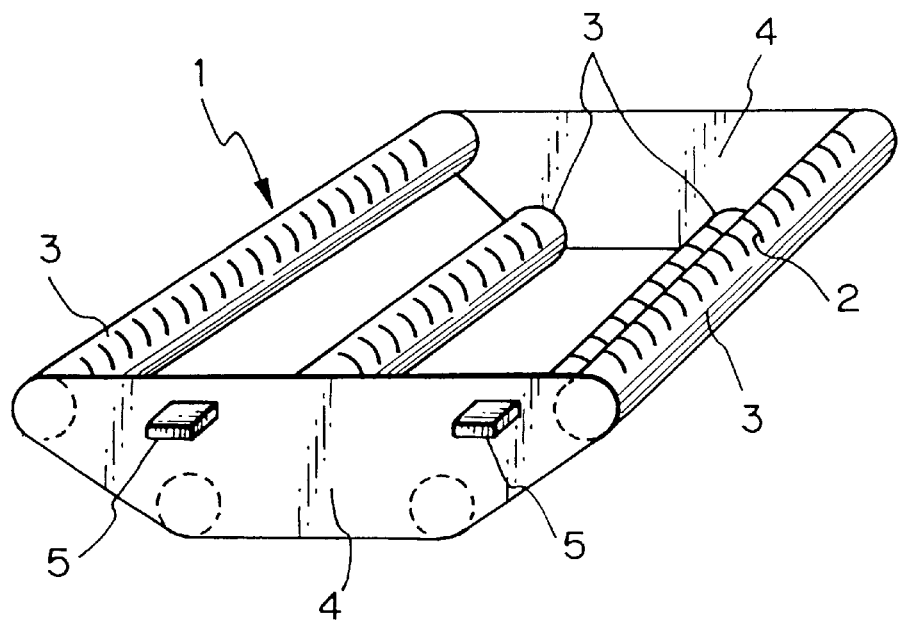
FIG. 2A is an external perspective view of a wafer carrier included in a wet processing system embodying the present invention.
Figure 2B:
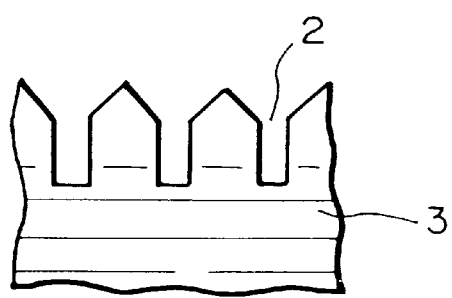
FIG. 2B is a fragmentary section of a bar included in the wafer carrier shown in FIG. 2A.
Figure 3:
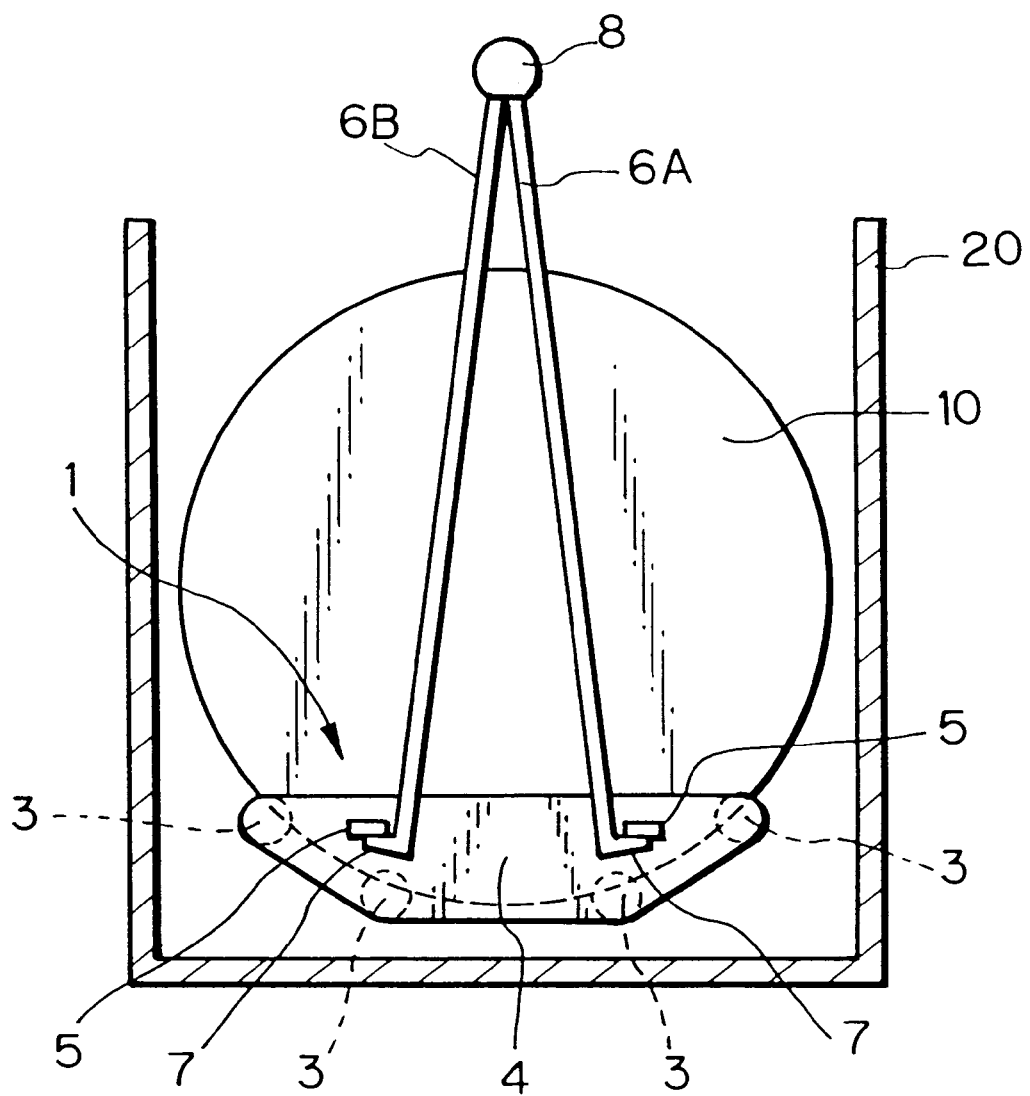
FIG. 3 is a side elevation showing the wafer carrier of the embodiment disposed in a processing bath, together with a transport jig.

Referring to FIGS. 2A, 2B and 3, a wet processing system embodying the present invention will be described. As shown, the processing system includes a wafer carrier 1 having four bars 3. The bars 3 are each made of Teflon and formed with a plurality of generally Y-shaped grooves 2 for inserting the edges of wafers 10. The bars 3 are arranged in a configuration complementary to the contour of the wafer 10. Each wafer 10 has its lower portion received in the aligned grooves 2 of the bars 3 and is held in an upright position thereby. A pair of support plates 4 support opposite ends of the bars 3, and each has a width smaller than the diameter of the wafer 10. In addition, the upper portion of the support plate 4 is positioned at level lower than the center of the wafer 10. Lugs 5 protrude from the upper portions of the outer surfaces of the support plates 4. A pair of arms 6A and 6B, constituting a transport jig, have generally L-shaped pawls 7 at their lower ends. The pawls 7 are capable of engaging with the lugs 5 of the support plates 4, as will be described later specifically.

Figure 4:
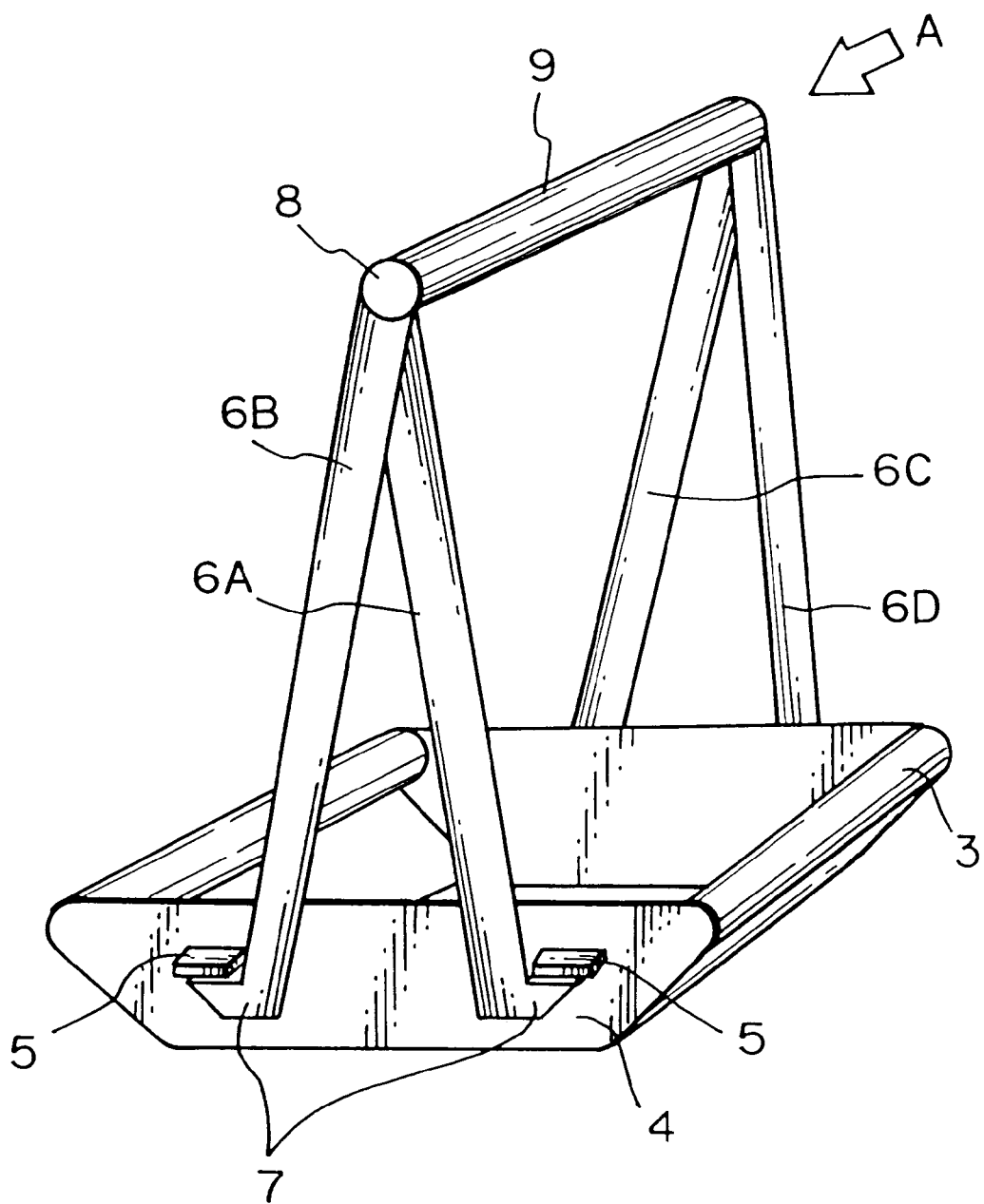
FIG. 4 is an external perspective view of the carrier and transport jig shown in FIG. 3.

After the wafer carrier I has been loaded with the wafers 10, it is transported to a bath 20 filled with chemicals or the like by the transport jig. As shown in FIGS. 3 and 4 specifically, the transport jig has a pair of arms 6C and 6D in addition to the pair of arms 6A and 6B. These arm pairs are connected to each other by a tie bar 9, and each is openable about a hinge 8. A spring, not shown, is loaded in each of the hinges 8 and constantly biases the associated arms 6A and 6B or 6C and 6D away from each other, i.e., in the opening direction. To cause the jig to retain the carrier 1, the operator holds the arms 6A–6D, then closes them, then brings the pawls 7 to below the lugs 5, and then releases the arms 6A–6D. As a result, the arms 6A–6D retain the carrier 1 with their pawls 7. In this condition, the operator can transport the carrier 1 simply by holding the tie bar 9. To automate the transport of the carrier 1, a motor, not shown, may be mounted on part of the tie bar 9 indicated by an arrow A in order to open and close the arms 6A–6D automatically. In such a case, the tie bar 9 will be mounted on a transporter movable in the up-and-down and right-and-left directions.

As stated above, in the illustrative embodiment, the wafer carrier 1 has the bars 3 formed with the grooves 2, and the support plates 4 provided with the lugs 5. This, coupled with the fact that the width of the support plates 4 is smaller than the diameter of the wafer 10, successfully reduces the size of the bath 20 and, therefore, the amounts of chemicals and pure water required. For example, for 8-inch wafers, the bath 20 of the embodiment needs a volume of only 30 litters. This is contrastive to the convention bath whose volume is as great as 40 litters. Moreover, because the carrier 1 is not box-shaped, it enhances the smooth flow of the aqueous solutions and thereby reduces to cleaning time to about 50% to 60% of the conventional cleaning time, while reducing the deposition of impurities on the wafers 10 to one-third.

In summary, it will be seen that the present invention provides a wet processing system capable of reducing a volume required of a processing bath, and promoting the smooth flow of aqueous solutions. Hence, the system reduces the consumption of chemicals and pure water as well as the cleaning time. These advantages are derived from a unique wafer carrier having bars formed with grooves for receiving the edge portions of wafers, and a pair of support plates having a width smaller than the diameter of the wafers.

Various modifications will become possible for those skilled in the art after receiving the teachings of the present disclosure without departing from the scope thereof. For example, while the embodiment has been shown and described as using four bars 3, it is practicable if provided with at least three bars. The port plates 4 each having an inverted trapezoidal configuration may be replaced with rectangular support plates. The lugs 5 of the support plates 4 may be bent downward in matching relation to the shape of the pawls 7 in order to allow the arms 6A–6D to hold the carrier 1 more positively.

What is claimed is:

1. A wet processing system comprising:
   a processing bath filled with chemicals;
   a wafer carrier for carrying wafers each having a first diameter; and
   a transport jig for conveying said wafer carrier by holding an upper end portion of said wafer carrier;
   said wafer carrier comprising:
   at least three bars each being formed with a plurality of grooves for receiving edge portions of the wafers;
   a pair of support plates supporting opposite ends of said at least three bars arranged complimentarily to a contour of the wafers such that said wafers are each held in an upright position with a lower portion thereof received in said grooves at least three points thereof;
   a pair of lugs protruding from an outer surface of an upper portion of each of said pair of support plates, and for retaining pawls of arms constituting said transport jig, so that said transport jig is engageable with said pair of support plates at opposite ends of said at least three bars and
   wherein the wafers are held in parallel with said pair of support plates. and a width of each of said support plates is less than a first diameter of each of said wafers to be accommodated in said wafer carrier, and
   wherein the entire upper end portion of said pair of support plates is positioned below a center of said wafers.

2. A system as claimed in claim 1, wherein said pair of lugs are each bent downward at an end thereof.

3. A wet processing system comprising:
   a processing bath filled with chemicals;
   a wafer carrier for carrying wafers each having a first diameter; and
   a jig for conveying said wafer carrier by holding said wafer carrier;
   wherein said wafer carrier comprises bars each being formed with a plurality of grooves for receiving edge portions of the wafers and holding the wafers by a portion thereof smaller than a diameter of the wafers,
   wherein said wafer carrier further comprises a pair of support plates supporting opposite ends of said bars, the wafers being held in parallel with said pair of support plates, and a width of each of said support plates is less than the first diameter of each of said wafers to be accommodated in said wafer carrier, and
   wherein an upper end of said support plates is positioned below a center of the wafers.

4. A system as claimed in claim 1, wherein each of said pair of support plates has a rectangular configuration.

5. A system as claimed in claim 1, wherein each of said pair of support plates has an inverted trapezoidal configuration.

6. A system as claimed in claim 1, wherein the arms of said jig include two pairs of spring-biased arms engageable with each of said pair of lugs of said pair of support plates, respectively, so that each of said two pairs of arms is biased outward against each of said pair of lugs.

* * * * *